United States Patent
Saramäki et al.

[11] Patent Number: 5,689,449
[45] Date of Patent: Nov. 18, 1997

[54] DECIMATION FILTER

[76] Inventors: Tapio Saramäki, Kreetarinkuja 4 A, FIN-33950 Pirkkala; Tapani Ritoniemi, Insinöörinkatu 84 B 31, FIN-33720 Tampere; Ville Eerola, Tohlopinkatu 15 A 2, FIN-33310 Tampere; Timo Husu, Kirkkokatu 12 B 23, FIN-80110 Joensuu; Eero Pajarre, Kanjoninkatu 11 C 26; Seppo Ingalsuo, Orivedenkatu 8 C 66, both of FIN-33720 Tampere, all of Finland

[21] Appl. No.: 522,361
[22] PCT Filed: Mar. 31, 1994
[86] PCT No.: PCT/FI94/00125
  § 371 Date: Sep. 27, 1995
  § 102(e) Date: Sep. 27, 1995
[87] PCT Pub. No.: WO94/23492
  PCT Pub. Date: Oct. 13, 1994

[30] Foreign Application Priority Data
  Apr. 5, 1993  [FI]  Finland ............... 931531

[51] Int. Cl.⁶ .................................. G06F 17/17
[52] U.S. Cl. ................. 364/724.1; 364/724.01; 364/724.03
[58] Field of Search ............. 364/724.1, 724.01, 364/724.11, 189, 724.13, 724.17, 724.03; 359/187, 158, 158.1, 161, 189; 341/143, 155, 61, 50

[56] References Cited

U.S. PATENT DOCUMENTS

| | | | |
|---|---|---|---|
| 4,509,037 | 4/1985 | Harris | 360/347 |
| 4,680,810 | 7/1987 | Swartz | 455/609 |
| 4,872,129 | 10/1989 | Pfeifer et al. | 364/724.1 |
| 4,972,356 | 11/1990 | Williams | 364/724.1 |
| 4,999,798 | 3/1991 | McCaslin et al. | 364/724.1 |
| 5,012,244 | 4/1991 | Wellard et al. | 341/143 |
| 5,070,310 | 12/1991 | Hietala et al. | 331/1 A |
| 5,148,167 | 9/1992 | Ribner | 341/143 |
| 5,166,642 | 11/1992 | Hietala | 331/1 A |
| 5,208,594 | 5/1993 | Yamazaki | 341/143 |

FOREIGN PATENT DOCUMENTS

| | | |
|---|---|---|
| 0501580 | 9/1992 | European Pat. Off. . |
| 0559154 | 9/1993 | European Pat. Off. . |
| 652875 | 11/1985 | Switzerland . |

*Primary Examiner*—Reba I. Elmore
*Assistant Examiner*—Ramesh Patel
*Attorney, Agent, or Firm*—Dennison, Meserole, Pollack & Scheiner

[57] ABSTRACT

The invention relates to a decimation filter comprising a direct cascade arrangement of digital first order and second order integration and derivation stages (22, 23, 25, 27) and a decimation stage. The decimation filter structure of the invention comprises additional branches (28, 29, 30, 31) for shifting the location of the attenuation zeros of the decimation filter and thereby reducing the order M and the number of structural elements M of the required filter.

12 Claims, 4 Drawing Sheets

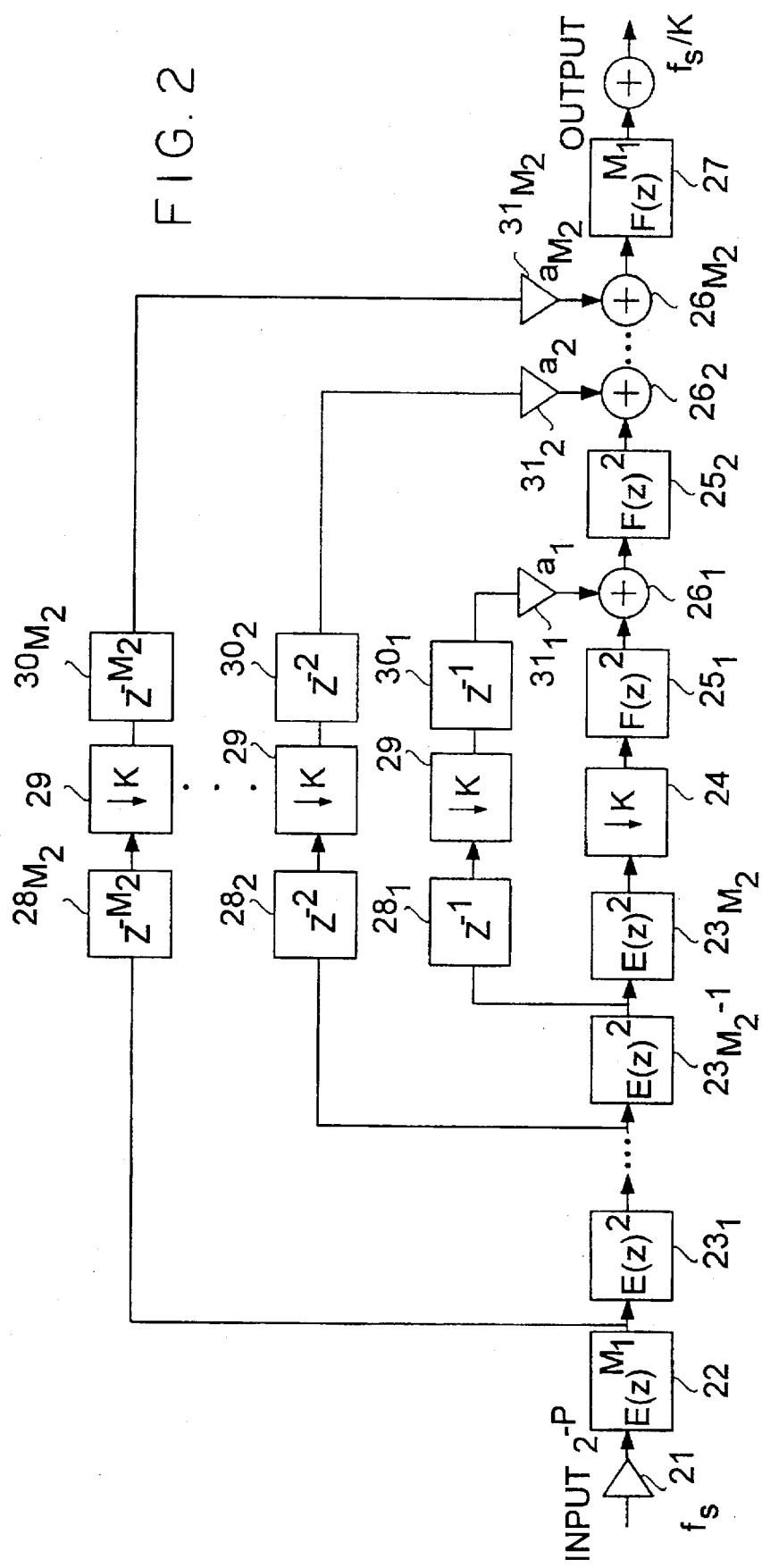
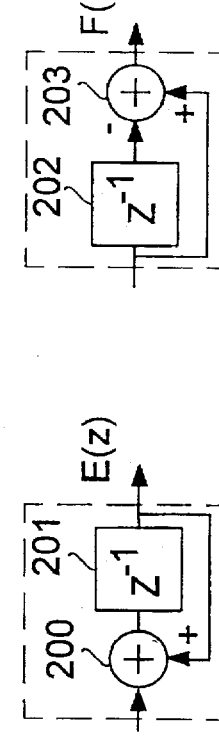
FIG. 2
FIG. 2A
FIG. 2B

DECIMATION FILTER

BACKGROUND OF THE INVENTION

The present invention relates to a decimation filter comprising a cascade arrangement of the following elements in the given order:

$M_1$ digital first order integration stages having a clock rate $F_s$ and a delay of one clock cycle, $M_2$ digital second order integration stages having a clock rate $F_2$ and a delay of two clock cycles, a decimation stage for decreasing the sampling frequency of the output signal from the last integration stage by a predetermined decimation ratio K, M digital derivation stages having a clock rate $F_s/K$, each comprising a delay element stage for delaying the input signal for one clock cycle and a subtractor element stage for subtracting the input signal from the output signal of the delay element, wherein $M=M_1+2M_2$.

A decimation filter is a digital filter wherewith the sampling frequency of a signal is decreased (decimated) by a number K (normally an integer) which is called the decimation ratio. A decimation filter is typically used in connection with an oversampling A/D or D/A converter (e.g. sigma-delta converter) to decrease the output sampling frequency of the converter.

Decimation can in principle be performed in one stage comprising a low-pass filter and a unit taking every K:th sample from the output of the low-pass filter, K being the decimation ratio. The filtering response of the low-pass filter must be such that the information carried by the output signal of the filter fits into the band according to the new sampling frequency. A problem attendant the decimation carried out in one stage will be that a low-pass filter having a very steep and narrow-band frequency response is needed. This problem has traditionally been overcome by performing the filtering and decimation in several stages, so that the product of the decimation ratios $K_1$, $K_2$, ... $K_n$ of the different decimation stages is the requisite decimation ratio K stated above. Thus the requirements on the characteristics of the low-pass filters required in the individual stages are relieved and their number of order is decreased so that the overall number of order in the low-pass filters of the different stages is only a fraction of that of a corresponding single-stage implementation. This is particularly the case when the decimation ratio M is high, e.g. >50.

The computationally efficient first stage for multistage decimators is provided by a transfer function $$H(z) = 2^{-P} \left[ \frac{1-z^{-K}}{1-z^{-1}} \right]^M,$$

where $2^{-P}$ is a scaling constant. It can be used as a first stage with decimation factor K in cases where the overall decimation factor D can be realized in the product $$D=KL,$$

where K and L are integers. The design and structure of such a filter have been described for instance in the article E. B. Hogenauer, "An economical class of digital filters for decimation and interpolation", in IEEE Trans. Acoust. Speech Signal Processing, pp. 155–162, vol. ASSP-29, April 1981. One known decimator structure satisfying the transfer function according to equation 1 is shown in FIG. 1. The decimator requires only 2M adders and 2M delay elements and no multiplying operations. Furthermore, FIG. 1 shows a scaling element 12 and a decimation block 13 forwarding only every K:th sample. It should be noted that if 1's or 2's complement arithmetic (or modulo arithmetic in general) and the worst-case scaling are used, the output values of a filter H(z) implemented as shown in FIG. 1 are correct even though internal overflows were to occur in the feedback loops realizing the term $1/(1-z^{-1})$. Furthermore, under the above conditions the effect of temporary miscalculations vanishes from the output in finite time and initial resetting is not necessarily needed. The scaling constant $2^{-P}$ has to satisfy the condition $$2^{-P} \leq (1/K)^M$$

The integer M for the prior art filter structure has to be selected in such a way that H(z) provides the required attenuation in the frequency bands $$[F_s/2(2r/K-1/D), F_s/2(2r/K+1/D)], r=1,2, \ldots, [K/2]$$

which alias into the frequency band $[0, F_s/2(1/D)]$ of the overall decimator. Herein $F_s$ is the input sampling frequency. The prior art structure shown in FIG. 1 is attended by the disadvantage that the zeros produced by the transfer function thereof are located at frequencies $F_s/K, 2*F_s/K, 3*F_s/K, \ldots, (K-1)*F_s/K$, and the integer M can only increase their number, i.e. the number of order of the filter. This results in that the number of structural elements in the prior art filter stage is unnecessarily high for the required attenuation at frequencies $[F_s/2(2r/K-1/D), F_s/2(2r/K+1/D)]$. A high number of structural elements increases the number of additions and delays required in the implementation. However, the major disadvantage is the increase of the gain of the filter when the number of order increases, and thus the number of additional bits required in the structure increases. The required number of additional bits is the smallest integer which is higher than $\log_2 K^M$.

OBJECTS OF THE INVENTION

The object of the present invention is a filter structure in which the number of structural elements can be considerably reduced in comparison with prior art structures having the same attenuations at frequencies $[F_s/2(2r/K-1/D), F_s/2(2r/K+1/D)]$. In the structure according to the invention, the necessary attenuation can be achieved with lower-order structures than was previously possible, on account of the better location of the attenuation zeros.

SUMMARY OF THE INVENTION

This is achieved with the decimation filter set forth in the preamble, which in accordance with the invention is characterized in that the decimation filter further comprises $M_2$ signal processing branches in such a way that between the input of the i:th second stage integrator subsequent to the $M_1$-stage integrator and the output of the derivation stage of the i:th second stage subsequent to the decimation block in the main branch a signal processing branch (realizes the $(i+K^*i)$ clock cycle delay at sampling frequency $F_s$ and the coefficient) is connected comprising, in series configuration, a first delay element having a delay of i clock cycles at sampling frequency $F_s$ of the output signal, a decimation stage for decreasing the sampling frequency of the first delay element by a predetermined decimation ratio K, a second delay element having a delay of i clock cycles at sampling frequency $F_s/K$, and a scaling element having a scaling factor $\alpha_i$ where $i=1,2,3,\ldots,M_2$.

The present invention also relates to another decimation filter as set forth in the preamble, which is characterized in that the decimation filter comprises $M_2$ signal processing branches in such a way that between the input of the i:th second stage integrator subsequent to $M_1$ and the output of the main branch a signal processing branch is connected comprising, in series configuration, a first delay element having a delay of i clock cycles at sampling frequency $F_s$ of the output signal, a decimation stage for decreasing the sampling frequency of the first delay element by a predetermined decimation ratio K, a second delay element having a delay of i clock cycles at sampling frequency $F_s/K$, a $(M_1+2(M_2-i))$-stage derivation block, and a scaling element having a scaling factor $\alpha_i$ where $i=1,2,3,\ldots,M_2$.

The decimation filter structure according to the invention comprises additional branches for shifting the location of the attenuation zeros of the decimation filter and thereby reducing the order M and the number of structural elements M of the required filter. As an example, let us consider a case With D=64 when a 120-dB attenuation is desired. With designs according to the invention, for K=16 the aliased terms are attenuated more than 120 dB by using $M_1=2$ and $M_2=2$. The scaling factors $a_1$, $a_2$ of the branches can be quantized to be integers which may in some cases be selected from powers of two. Where the decimation filter of the invention is realized as an integrated circuit, the use of these additional branch coefficients increases the silicon area occupation in the configuration of the integrated circuit only by 10% compared to the prior art configuration having six terms (M=6). Without additional branches, eight terms (M=8) would be required to provide the desired attenuation in the prior art solution. Such a prior art filter would further require a higher internal wordlength (8 bits more, i.e. more than 30% in excess of that of the exemplified pre-filter stage of the sigma-delta modulator which has six terms), and the number of delay elements and adders would be higher. In an integrated circuit design, the estimated saving in silicon area occupation achieved with the invention over the corresponding known solution is about 30% for the case where these filters are used as first filter stages in the decimation of a one-bit data stream from a sigma-delta modulator. The structure now disclosed has the further advantage of lower amplitude distortion within the passband, thus facilitating error correction. Furthermore, in several implementations the calculation accuracy of the prior art structure becomes too high, and thus either the speed of the circuit configurations or the clock signals in the system preclude the use of the prior art structure.

In the following the invention will be set forth in greater detail by means of illustrating embodiments with reference to the accompanying drawings.

BRIEF DESCRIPTION OF THE DRAWINGS

FIG. 2 is a block diagram illustrating a decimation filter according to the invention, FIG. 2A shows an integration shape.

FIG. 2B shows a derivation shape.

DETAILED DESCRIPTION OF THE INVENTION

Figure 1:
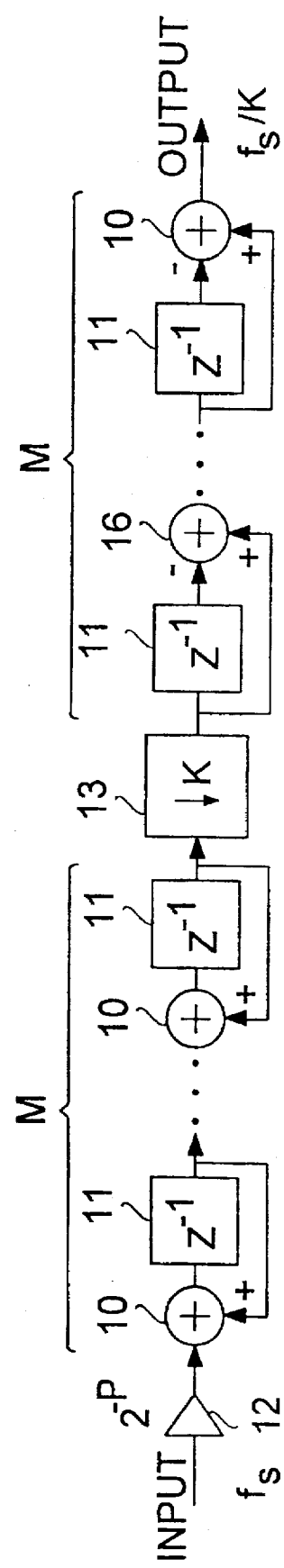
FIG. 1 is a block diagram illustrating a prior art decimation filter.

Reference will now be made to FIG. 2, illustrating a decimation filter stage according to the invention. This decimation filter stage decreases the sampling frequency $F_s$ of a signal applied to the input IN, said signal preferably being a one-bit data stream from a sigma-delta modulator, so that the sampling frequency of the data stream at the output OUT of the filter is $F_s/K$. Factor K is called the decimation ratio. At the input of the filter, a scaling element 21 having a scaling factor $2^{-P}$ is first provided. Subsequent to the scaling element 21, an integration block $E(z)^{M_1}$ comprising in series configuration $M_1$ integration stages $E(z)$ as shown in FIG. 2A is connected in series.

In FIG. 2A, the integration stage $E(z)$ comprises a series connection of adder 200 and delay means 201. The input signal of the integration stage is applied to one input of the adder 201, and the output signal of the delay means 201, which at the same time provides the output signal of the entire integration stage, is fed back to the second input of the adder 200. The added signal obtained at the output of the adder 200 is applied to the delay means 201.

In FIG. 2, subsequent to the integration block $E(z)^{M_1}$, a series connection of M2 second order integration blocks $E(z)^2$ is provided. Each of these blocks comprises in series configuration two integration stages as shown in FIG. 2A. After the last integration stage $E(z)^2$, denoted by reference $23_{M_2}$, a decimation block 24 is connected which forwards every K:th sample from the output of the integration stage $23_{M_2}$. After the decimation block 24, $M_2$ second order derivation blocks $F(z)^2$, denoted with references $25_1, 25_2, \ldots 25_{M_2}$ respectively, are connected in series. Each second order derivation block $F(z)^2$ comprises in a series connection a pair of derivation stages $F(z)$ shown in FIG. 2B. After the second order derivation stage $F(z)^2$, a series connection of adders $26_1, 26_2, \ldots 26_{M_2}$ is provided ahead of the next second order block. These adders add the outputs of the blocks together with the signal from the corresponding branch prior to application to the next block. After the last derivation stage $25_{M_2}$ and adder $26_{M_2}$, a derivation block $F(z)^{M_1}$, comprising in series configuration M1 derivation stages as shown in FIG. 2B, is connected in series.

The derivation stage $F(z)$ of FIG. 2B comprises a series connection of delay means 202 and subtractor 203. The input signal is applied to adder 203 both directly and via delay means 202 having a delay of one clock cycle, and the differential signal is applied to the output of the stage.

The decimation filter further comprises M2 signal processing branches in such a way that between the input of the i:th second order integrator after the $M_1$-stage integrator and the output of the i:th second order derivation stage $F(z)^2$ after the decimation block 24 of the main branch a signal processing branch is connected which comprises, in series configuration, a first delay element 28 having a delay of i clock cycles at sampling frequency $F_s$ of the output signal, a decimation stage 29, corresponding to decimation stage 24, for decreasing the sampling frequency of the first delay element by a predetermined decimation ratio K, a second delay element 30 having a delay of i clock cycles at sampling frequency $F_s/K$, and a scaling element 31 having a scaling factor $\alpha_i$ where $i=1,2,3,\ldots,M_2$. Thus for example from the input of integration stage $23_{M_2}-1$, there is an outgoing feedforward signal processing branch comprising a delay means $28_2$ having a delay $z^{-2}$ of two clock cycles at clock rate Fs, a decimation stage 29, a delay means $30_2$ having a delay $z^{-2}$ of two clock cycles at clock rate $F_s/K$, and a scaling element $31_2$ having a scaling factor $A_2$. The output of each scaling element $31_1, 31_2, \ldots 31_{M_2}$ is coupled to the second input of the corresponding adder $26_1, 26_2, \ldots 26_{M_2}$.

The overall transfer function of the filter of FIG. 2 is $$H(z) = 2^{-P} \left[ z^{-1} \frac{1-z^{-K}}{1-z^{-1}} \right]^{M_1} \left[ \left[ z^{-1} \frac{1-z^{-K}}{1-z^{-1}} \right]^{2M_2} + \sum_{i=1}^{M_2} a_i z^{-i(K+1)} \left[ z^{-1} \frac{1-z^{-K}}{1-z^{-1}} \right]^{2(M_2-i)} \right]$$

Figure 3:
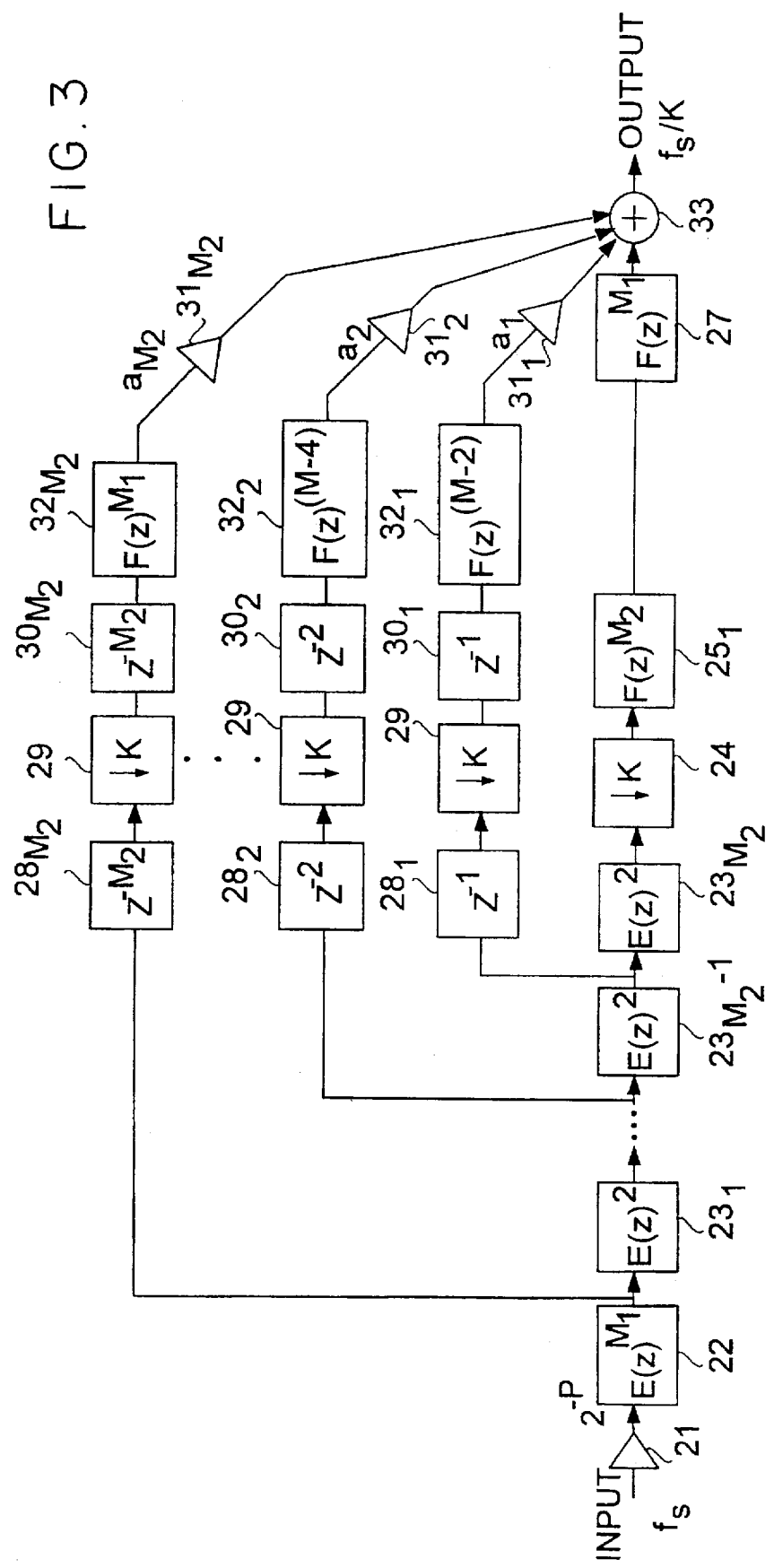
FIG. 3 is a block diagram illustrating another decimation filter according to the invention.

Another alternative filter structure for realizing the above transfer function is shown in FIG. 3. In FIG. 3, blocks and elements that are the same as in FIG. 2 have been denoted with the same references and symbols. As in FIG. 2, also in FIG. 3 the arrangement comprises—starting from the input IN and in the following sequence—a series connection of a scaling element 21, an M1-stage integration block 22, M2 second order integration blocks $23_1 \ldots 23_{M_2}$, and a decimation block 24. After the decimation stage 24, a derivation block 25, is connected comprising in a series connection M2 derivation blocks F(z) as shown in FIG. 2B, a derivation block 27 comprising in a series connection M1 derivation stages F(z), and an adder 33.

The decimation filter of FIG. 3 further comprises M2 signal processing branches in such a way that between the input of the i:th second stage integrator 23 after $M_1$ and the adder 33 in the output of the main branch a signal processing branch is connected which comprises, in a series connection, a first delay element 28 having a delay of i clock cycles at sampling frequency $F_s$ of the output signal, a decimation stage 29, corresponding to decimation stage 24, for decreasing the sampling frequency of the output signal of the first delay element by a predetermined decimation ratio K, a second delay element 30 having a delay of i clock cycles at sampling frequency $F_s/K$, an $(M_1+2(M_2-i))$-stage derivation block 32, and a scaling element 31 having a scaling factor $\alpha_i$ where $i=1,2,3,\ldots,M_2$. Thus for example from the input of the second order integrator $23_{M_2}-1$, there is an outgoing feedforward signal processing branch comprising a delay means $28_2$ having a delay of two clock cycles at clock rate Fs, a decimation stage 29, a delay means $30_2$ having a delay of two clock cycles at clock rate $F_s/K$, a derivation block $32_2$ comprising (M−4) derivation stages F(z), and a scaling element $31_2$ having a scaling factor $A_2$.

The filter structure of FIG. 2 can be used when the scaling factors $\alpha_i$ can be quantized to be integers. The filter structure of FIG. 3 can also be used with decimal factors (fractions) $\alpha_i$.

Figure 4:
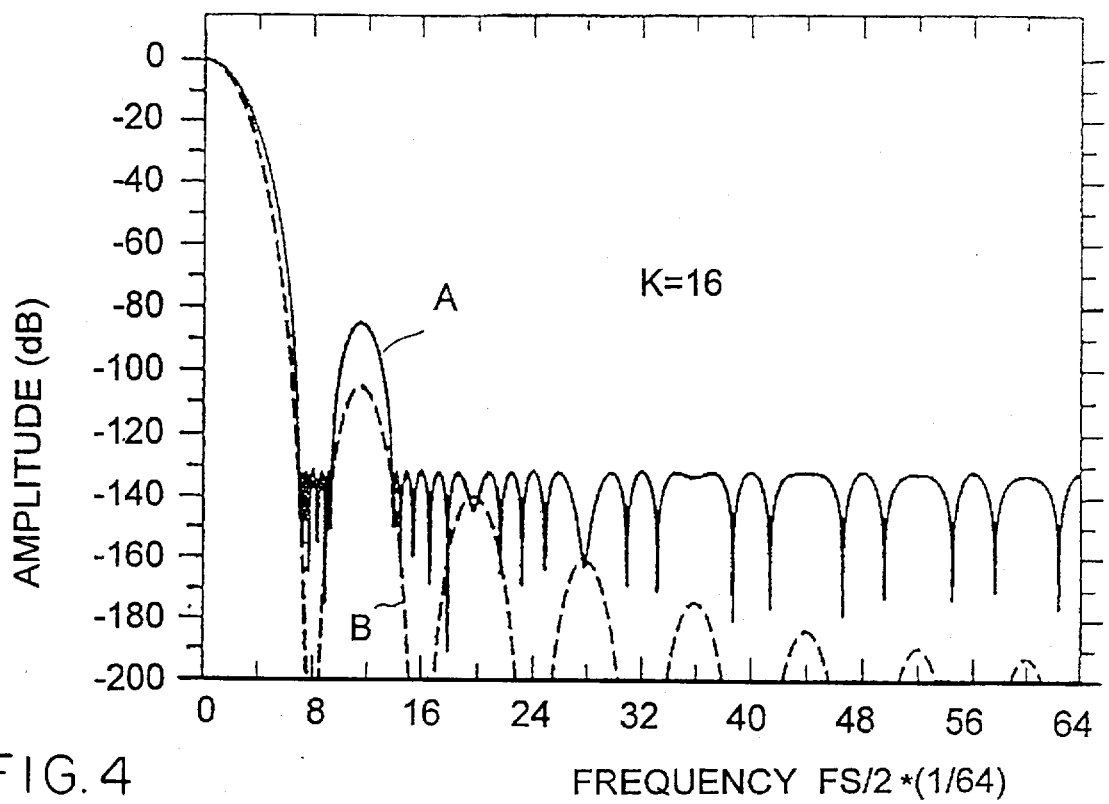
FIGS. 4 and 5 show frequency responses of a prior art filter and a filter according to the invention.
Figure 5:
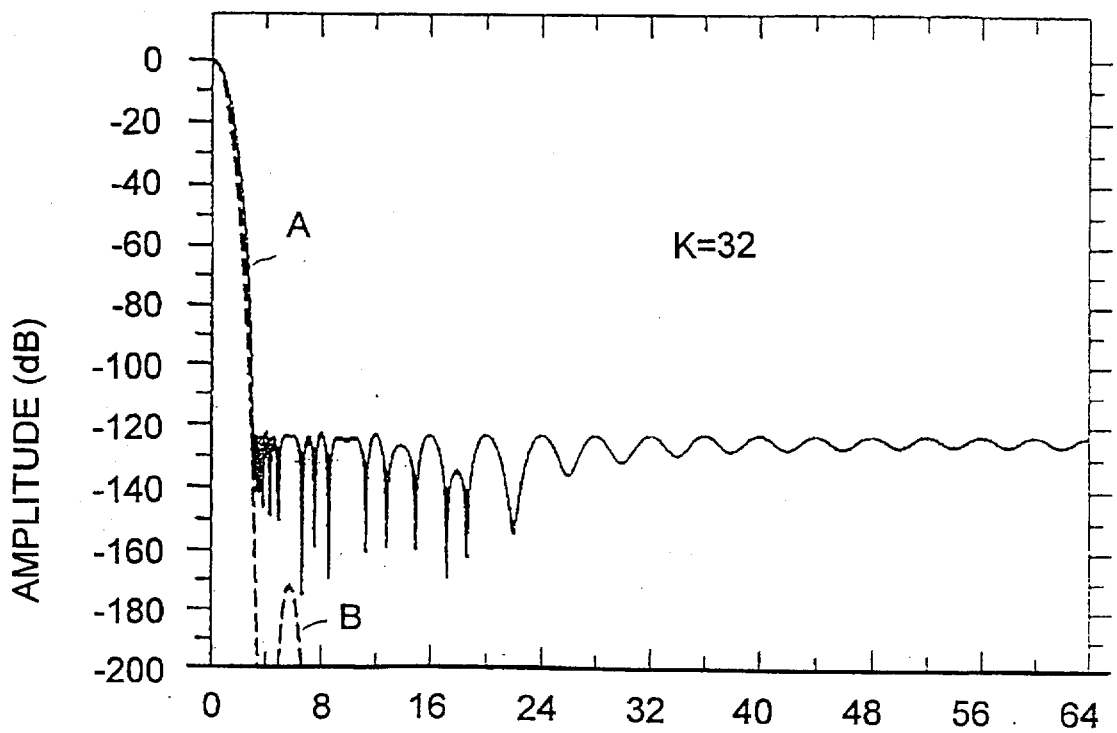

Let us next consider an exemplary case with D=64 when a 120-dB attenuation is desired. For a decimation ratio K=16, the aliased terms at the desired frequency bands are attenuated more than 120 dB by using $M_1=2$ and $M_2=2$. In this case, the scaling factors $a_1$ and $a_2$ can be quantized to be integers, so as to provide altogether six integration and derivation blocks (the branches are of the feedforward type). The frequency response obtained with the filter of the invention is shown by a solid line A in FIG. 4. The corresponding prior art filter requires eight terms, and its response is shown by a dashed line B in FIG. 4. When the decimation ratio K is increased to K=32, the prior art filter structure requires thirteen terms, whereas the proposed branched filter structure only requires eight terms. In FIG. 5, the solid line A and dashed line B represent the filter responses of the filter of the invention and the prior art filter, respectively.

The circuit is generally executed on silicon using parallel arithmetic in the integrator part and serial arithmetic in the derivation blocks. The parallel part takes up about ¾ of the area, owing mainly to the arithmetic (parallel adders). The proportion of the delay in the parallel part is about 15%. The integration in the decimation circuit is performed between the derivation blocks by control and a parallel/series register which is very uncomplicated. The area of the serial derivation part is mostly taken up by the delays, since the arithmetic (the adder is only one-bit adder, yet the delay of one sample is equal in parallel and series configurations) is one-bit arithmetic. In the structure now disclosed, the delays (delay elements) ahead of the decimation as well as the actual decimation can be realized by means of a parallel/series register and control. Only the additional delays after decimation have to be realized; mathematically all delays are present in accordance with the block diagrams. This affords considerable saving in silicon area occupation. The scaling factors can be realized with an accuracy of a few bits.

The figures and the description relating to them are only intended to illustrate the present invention. The decimation filter of the invention can vary in its details within the scope and spirit of the appended claims.

We claim:

1. A decimation filer comprising a cascade arrangement of the following elements in the given order:

$M_1$ digital first order integration stages having a clock rate $F_s$ and a delay of one clock cycle, $M_2$ digital second order integration stages having a clock rate $F_2$ and a delay of two clock cycles, a decimation stage for decreasing the sampling frequency of the output signal from the last integration stage by a predetermined decimation ration K, M digital derivation stages having a clock rate $F_s/K$, each comprising a delay element stage for delaying the input signal for one clock cycle and a subtractor element stage for subtracting the input signal from the output signal of the delay element, wherein $M=M_1+2M_2$, $M_2$ signal processing branches in such a way that between the input of the i:th second stage integrator subsequent to the $M_1$-stage integrator and the output of the derivation stage of the i:th second stage subsequent to the decimation block in the main branch a signal processing branch is connected including, in series configuration, a first delay element having a delay of i clock cycles at sampling frequency $F_s$ of the output signal, a decimation stage for decreasing the sampling frequency of the first delay element by a predetermined decimation ratio K, a second delay element having a delay of i clock cycles at sampling frequency $F_s/K$, and a scaling element having a scaling factor $\alpha_i$ where $i=1,2,3,\ldots,M_2$.

2. A decimation filter as claimed in claim 1, wherein at the input of the decimation filter, a scaling element is provided for scaling the input signal by a factor $2^{-P}$.

3. A decimation filter as claimed in claim 2, wherein $M_1=M_2=2$.

4. A decimation filter as claimed in claim 3, wherein the scaling factors $a_{Mi}$ are integers.

5. A decimation filter as claimed in claim 1, wherein $M_1=M_2=2$.

6. A decimation filter as claimed in claim 5, wherein the scaling factors $a_{Mi}$ are integers.

7. A decimation filter comprising a cascade arrangement of the following elements in the given order:

$M_1$ digital first order integration stages having a clock rate $F_s$ and a delay of one clock cycle, $M_2$ digital second order integration stages having a clock rate $F_2$ and a delay of two clock cycles, a decimation stage for decreasing the sampling frequency of the output signal from the last integration stage by a predetermined decimation ratio K, M digital derivation stages having a clock rate $F_s/K$, each comprising a delay element stage for delaying the input signal for one clock cycle and a subtractor element stage for subtracting the input signal from the output signal of the delay element, wherein $M=M_1+2M_2$, $M_2$ signal processing branches in such a way that between the input of the i:th second stage integrator subsequent to $M_1$ and the output of the main branch a signal processing branch is connected including, in series configuration, a first delay element having a delay of i clock cycles at sampling frequency $F_s$ of the output signal, a decimation stage for decreasing the sampling frequency of the first delay element by a predetermined decimation ratio K, a second delay element having a delay of i clock cycles at sampling frequency $F_s/K$, a $(M_1+2(M_2-i))$-stage derivation block, and a scaling element having a scaling factor $\alpha_{1,}$ where i=1,2,3, . . . , $M_2$.

8. A decimation filter as claimed in claim 7, wherein the input of the decimation filter, a scaling element is provided for scaling the input signal by a factor $2^{-p}$.

9. A decimation filter as claimed in claim 8, wherein $M_1=M_2=2$.

10. A decimation filter as claimed in claim 9, wherein the scaling factors are realized with an accuracy of only a few bits.

11. A decimation filter as claimed in claim 7, wherein $M_1=M_2=2$.

12. A decimation filter as claimed in claim 11, wherein the scaling factors are realized with an accuracy of only a few bits.

* * * * *